United States Patent
Cheng et al.

(10) Patent No.: US 10,679,906 B2
(45) Date of Patent: Jun. 9, 2020

(54) METHOD OF FORMING NANOSHEET TRANSISTOR STRUCTURES WITH REDUCED PARASITIC CAPACITANCE AND IMPROVED JUNCTION SHARPNESS

(71) Applicant: International Business Machines Corporation, Armonk, NY (US)

(72) Inventors: Kangguo Cheng, Schenectady, NY (US); Chanro Park, Saratoga, NY (US); Ruilong Xie, Schenectady, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/036,984

(22) Filed: Jul. 17, 2018

(65) Prior Publication Data
US 2020/0027959 A1    Jan. 23, 2020

(51) Int. Cl.
*H01L 21/8238* (2006.01)
*H01L 29/49* (2006.01)
(Continued)

(52) U.S. Cl.
CPC ............ *H01L 21/823821* (2013.01); *H01L 21/02167* (2013.01); *H01L 21/02532* (2013.01); *H01L 21/02603* (2013.01); *H01L 21/764* (2013.01); *H01L 21/76895* (2013.01); *H01L 21/823814* (2013.01); *H01L 21/823878* (2013.01); *H01L 23/535* (2013.01); *H01L 29/0673* (2013.01); *H01L 29/42392* (2013.01); *H01L 29/4908* (2013.01); *H01L 29/4991* (2013.01); *H01L 29/66545* (2013.01); *H01L 29/66742* (2013.01); *H01L 29/78618* (2013.01); *H01L 29/78651* (2013.01); *H01L 29/78696* (2013.01); *H01L 21/3085* (2013.01); *H01L 21/30604* (2013.01)

(58) Field of Classification Search
CPC ..... H01L 21/823814; H01L 21/823878; H01L 21/823821; H01L 21/02532; H01L 21/02603; H01L 21/283; H01L 21/3085; H01L 21/30604; H01L 21/02167; H01L 21/764; H01L 21/76895
See application file for complete search history.

(56) References Cited

U.S. PATENT DOCUMENTS

| 8,513,067 B2 | 8/2013 | Huang et al. |
| 9,362,355 B1 | 6/2016 | Cheng et al. |

(Continued)

*Primary Examiner* — Michael Jung
(74) *Attorney, Agent, or Firm* — Cantor Colburn LLP; Joseph Petrokaitis (57) ABSTRACT

Nanosheet transistor structures with reduced parasitic capacitance and improved junction sharpness generally include a bilayer spacer adjacent a dummy gate disposed on a nanosheet stack. The bilayer spacer includes an inner spacer layer on sidewalls of the gate and a sacrificial layer on the inner spacer layer. The sacrificial layer can be laterally trimmed to bring the in situ doped source/drain regions closer to the channel, which improves junction sharpness. Additionally, the sacrificial spacer layer can be later removed during the process for forming the transistor so as to form an airgap spacer adjacent the gate, which minimizes parasitic capacitance.

15 Claims, 7 Drawing Sheets

(51) Int. Cl.
*H01L 29/786* (2006.01)
*H01L 29/66* (2006.01)
*H01L 29/423* (2006.01)
*H01L 23/535* (2006.01)
*H01L 21/02* (2006.01)
*H01L 21/764* (2006.01)
*H01L 21/768* (2006.01)
*H01L 29/06* (2006.01)
*H01L 21/308* (2006.01)
*H01L 21/306* (2006.01)

(56) References Cited

U.S. PATENT DOCUMENTS

| | | |
|---|---|---|
| 9,773,886 B1 | 9/2017 | Palle et al. |
| 9,799,748 B1 | 10/2017 | Xie et al. |
| 9,853,132 B2 | 12/2017 | Cheng et al. |
| 9,929,235 B1 * | 3/2018 | Yang ............... H01L 29/78696 |
| 2014/0001441 A1 * | 1/2014 | Kim .................. H01L 29/0673 257/29 |
| 2017/0110554 A1 | 4/2017 | Tak et al. |
| 2017/0250261 A1 | 8/2017 | Kim et al. |
| 2017/0294537 A1 | 10/2017 | Cheng et al. |
| 2017/0309719 A1 * | 10/2017 | Sun .................. H01L 29/42392 |
| 2017/0365604 A1 | 12/2017 | Suh et al. |
| 2018/0301564 A1 * | 10/2018 | Kwon .............. H01L 29/78618 |

* cited by examiner

METHOD OF FORMING NANOSHEET TRANSISTOR STRUCTURES WITH REDUCED PARASITIC CAPACITANCE AND IMPROVED JUNCTION SHARPNESS

BACKGROUND

The present invention relates in general to integrated circuit device structures and their fabrication. More particularly, the present invention relates to transistor structures with reduced parasitic capacitance and improved junction sharpness.

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Non-planar MOSFET architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistors enable fuller depletion in the nanosheet channel regions and reduce short-channel effects.

SUMMARY

Embodiments of the present invention are generally directed to integrated circuits including transistor structures and methods of fabricating the same. A non-limiting example of a transistor structure according to aspects of the invention include nanosheet stacked channels formed on a substrate. A gate is formed on the nanosheet stacked channels and sidewalls thereof. A bilayer spacer is vertically arranged along the gate and the nanosheet stacked channels. The bilayer spacer includes an inner dielectric spacer and an airgap dielectric spacer separating the gate from an epitaxially grown source or drain (S/D) region. Each end portion of the nanosheet channel extends beyond the bilayer spacer to the S/D region. Metal conductor filled contacts are provided on a top surface and a portion of an inner sidewall of the S/D region.

A non-limiting example of a method for forming a nanosheet transistor with reduced parasitic capacitance and improved junction sharpness according to aspects of the invention includes depositing a bilayer including an inner spacer layer and a sacrificial layer on a dummy gate, wherein the dummy gate is formed on a nanosheet stack that includes Si layers and SiGe layers. The SiGe layers are laterally etched relative to the Si layers such that W is greater than t, wherein W is a lateral etch width and t is a gap distance between Si layers. An inner spacer is formed adjacent the SiGe layers having a width such that the Si layer has exposed end portions. Source or drain (S/D) regions are epitaxially grown from the exposed end portions of the Si layer. An interlevel dielectric layer is deposited. The dummy gate and remaining portions of the SiGe layers are selectively removed, and a high-k dielectric-metal gate structure is deposited therein. Contacts are formed in the interlevel dielectric layer to the S/D regions. The sacrificial layer is selectively removed to form a gap between the inner spacer layers adjacent the gate and the contacts. A dielectric is non-conformally deposited into the gap to form an airgap spacer therein.

A non-limiting example of a method for forming a nanosheet transistor with reduced parasitic capacitance and improved junction sharpness according to aspects of the invention includes depositing a dummy gate onto the nanosheet stack and sidewalls thereof, the nanosheet stack including epitaxially deposited silicon layers sandwiched between SiGe layers. A bilayer spacer is deposited onto sidewalls of the dummy gate including a SiBCN layer in direct contact with the sidewalls and a SiCO sacrificial layer on the SiBCN layer. The nanosheet stack is recessed to form openings for source or drain (S/D) regions, wherein the openings are self-aligned to the SiCO sacrificial layer. The SiGe layers are laterally etched to create a gap between Si layers, wherein W>t, wherein W is a lateral etch width of the SiGe removed, wherein t is a vertical distance between Si layers. A first dielectric layer is conformally deposited in an amount effective to fill the gap between the Si layers. The first dielectric layer is etched back to form an inner spacer layer of the first dielectric on sidewalls of the SiGe layers and expose end portions of the Si layers. The S/D regions are epitaxially grown from the exposed end portions of the Si layers to the substrate. The dummy gate and the SiGe layer between the Si layers are removed to form openings therein. A high-k dielectric-metal gate structure is formed in the openings. A top portion of the high-k dielectric-metal gate structure is recessed and a dielectric gate cap deposited therein. Contacts to the source or drain regions are formed. The SiCO sacrificial spacer layer is selectively removed to form a gap between the high-k-metal gate structure and the contacts. A second dielectric is non-conformally deposited in the gap for form an airgap spacer.

BRIEF DESCRIPTION OF THE DRAWINGS

The subject matter of embodiments is particularly pointed out and distinctly defined in the claims at the conclusion of the specification. The foregoing and other features and advantages are apparent from the following detailed description taken in conjunction with the accompanying drawings in which:

DETAILED DESCRIPTION

For a transistor structure such as a MOSFET, it is generally desired to increase junction sharpness between the source or drain (S/D) regions and a channel while minimizing parasitic capacitance between the epitaxial S/D and gate of a transistor structure such as a MOSFET. However, these features compete against one another. For example, bringing in situ doped epitaxial S/D regions closer to the channel with a narrow spacer can improve junction sharpness but at the detriment of increasing parasitic capacitance between the epitaxial S/D region and the gate. Likewise, using a larger spacer effectively reduces parasitic capacitance but the dopants in the in situ doped S/D regions have to diffuse a much longer pathway to the channel, which results in an increased junction gradient that is deleterious for device performance. In the present invention, methods and structures are provided for forming a transistor with improved junction sharpness and reduced parasitic capacitance by decoupling these competing features with an air spacer. As will be described in greater detail herein, a sacrificial spacer layer is utilized in a manner that improves junction sharpness while minimizing parasitic capacitance. The sacrificial layer can be utilized in nanosheet transistors as well as fin field effect transistors (finFET) transistors.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel region. Disposed above the channel region is a gate electrode. The gate electrode and the channel region are spaced apart by a gate dielectric layer. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a gate all around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels (e.g., Si, SiGe) between the source and drain regions. A gate surrounds the stacked nanosheet channels and regulates electron flow through the nanochannels between the source and drain regions. GAA nanosheet FETs are fabricated by forming alternating layers of channel nanosheets and sacrificial nanosheets that are removed during the fabrication process. For n-type FETs, the channel nanosheets are silicon (Si) and for p-type FETs, the channel nanosheets are SiGe. Forming the GAA nanosheets from alternating layers of channel nanosheets formed from a first type of semiconductor material and sacrificial nanosheets formed from a second type of semiconductor material provides superior channel electrostatics control, which is necessary for continuously scaling gate lengths down to seven (7) nanometer (nm) technology and below.

As previously noted herein, some non-planar transistor architectures such as the nanosheet FET employ semiconductor fins and side-gates that can be contacted outside the active region, resulting in increased device density over lateral devices. There are challenges, however, in providing nanosheet FETs with equal or superior performance characteristics to lateral devices. One such challenge is the mitigation or elimination of the parasitic capacitance associated with nanosheet FETs. Parasitic capacitance between two conductors (also known as conductor-to-conductor capacitance) is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices. In a nanosheet FET, a pathway for undesired capacitive coupling between the gate and the substrate can exist when the gate and the substrate are sufficiently close to each other. In known nanosheet FET configurations, the gate is spaced apart from the channel nanosheets and the substrate by a gate dielectric layer. Because it is desirable to use a relatively thin gate dielectric layer between the channel nanosheets and the gate to satisfy other nanosheet FET performance requirements (e.g., low voltage and low power dissipation), known nanosheet FET configurations having thin gate dielectric layers provide a pathway for unwanted capacitive coupling through the gate, the thin gate dielectric, and the substrate.

Another challenge associated with GAA nanosheet FETs is the difficulty in reducing undesirable effects such as short channel effects and punch-through (i.e., leakage currents). Punch-through occurs when an undesired current pathway is formed through a portion of the substrate under the channel and the gate. These undesired current pathways are referred to herein as under channel pathways, which allow leakage currents to pass from the source to the drain of the transistor, bypassing the nanosheets. Forming S/D regions that extend below an upper surface of the substrate (also known as recessed S/D regions), for example, contributes to the formation of an under channel pathway. S/D regions are commonly formed in a junction recess in the substrate in conventional GAA nanosheet FETs. Consequently, an upper region of the substrate between portions of the recessed S/D regions can serve as an under channel pathway. When a voltage is applied to the gate of the nanosheet FET that is greater than a threshold voltage, current flows through the channel nanosheets and through the under channel pathway, reducing channel electrostatics control and ultimately degrading device performance. Consequently, it is desirable to suppress an under channel pathway from conducting undesired leakage currents. Conventional approaches to suppress these under channel pathways have not been wholly successful. In some conventional nanosheet FETs, for example, a surface portion of the substrate is doped using a punch-through-stopper (PTS) scheme to reduce the conductivity of the under channel pathway. The heavy doping associated with PTS, however, results in secondary consequences that degrade device performance (causing, e.g., stacking faults which lead to poor active channel epitaxial growth).

Turning now to an overview of aspects of the present invention, one or more embodiments of the invention provide fabrication methods and resulting structures that increase junction sharpness while reducing unwanted capacitance between the gate and the substrate of a nanosheet FET. Fabrication methods and resulting semiconductor device structures in accordance with embodiments of the invention are described in detail below by referring to the accompanying drawings in FIGS. 1-14.

Figure 1:
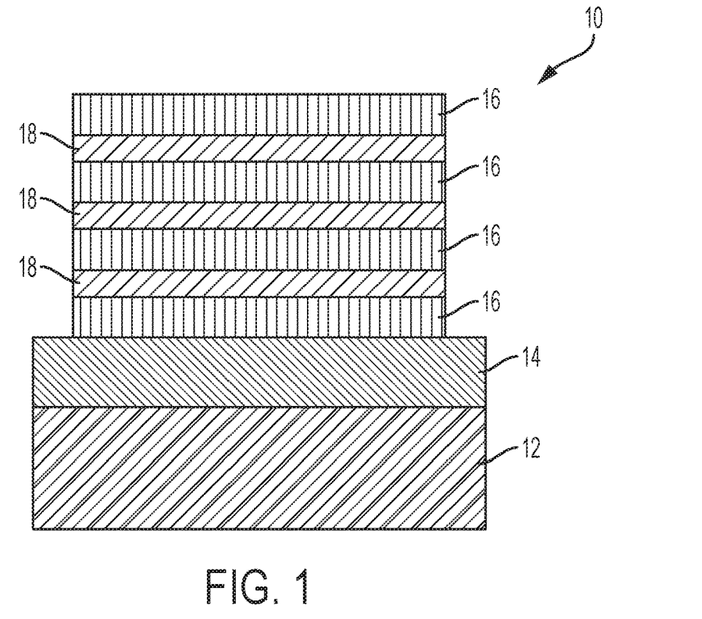
FIG. 1 depicts a cross-sectional view of a semiconductor structure after a fabrication operation according to one or more embodiments of the present invention.

FIG. 1 depicts a cross-sectional view of a semiconductor structure 10 illustrating a starting structure after initial fabrication operations according to embodiments of the invention. The initial fabrication operations include epitaxially growing alternating layers of silicon germanium (SiGe) 16 and silicon (Si) 18 on a substrate 12 configured and arranged as shown. The alternating Si and SiGe layers 16, 18 are collectively referred to herein as a nanosheet stack and can be further processed to define the NFET region and the PFET region. A shallow trench isolation region (not shown) can be used to separate the NFET region from the PFET region.

The germanium content of the different SiGe layers varies, wherein the germanium content can have a Ge concentration from about 5 atomic percent to about 75 atomic percent in one or more embodiments, and from about 10 atomic percent to about 50 atomic percent in one or more other embodiments, and from about 20 atomic percent to about 40 atomic percent in still other embodiments.

In one or more embodiments, the thicknesses of the Si layer and the SiGe layer can be about 4 to about 10 nm, although greater or lesser thicknesses are contemplated.

As noted above, the Si and SiGe layers can be epitaxially grown. The Si and SiGe layers can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Non-limiting examples of suitable materials for the substrate 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

Non-limiting examples of substrate 16 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) and silicon-germanium-on-insulator (SGOI) substrates with buried oxide (BOX) layers. As depicted in FIG. 1, the substrate 12 includes a BOX layer 14 thereon.

Figure 2:
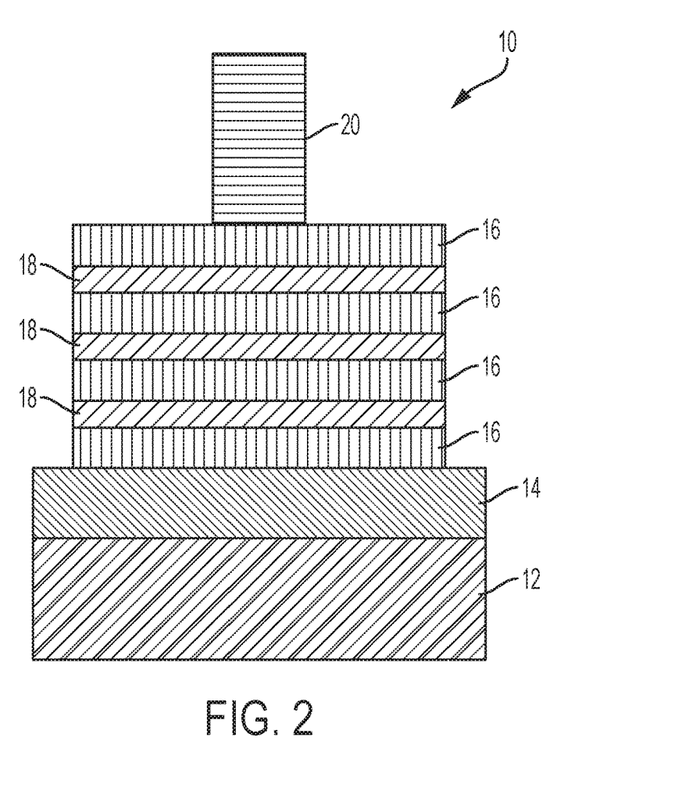
FIG. 2 depicts a cross-sectional view of the semiconductor structure after a fabrication operation according to one or more embodiments of the present invention.

FIG. 2 depicts a cross-sectional view of the semiconductor structure 10 of FIG. 1 after deposition and patterning of a dummy gate 20, e.g., a dummy gate oxide and amorphous silicon with a gate dielectric cap on the nanosheet stack. The dummy gate 20 is transverse to the nanosheet stack, i.e., the dummy gate 20 is formed on top and sidewalls of the nanosheet stack.

Figure 3:
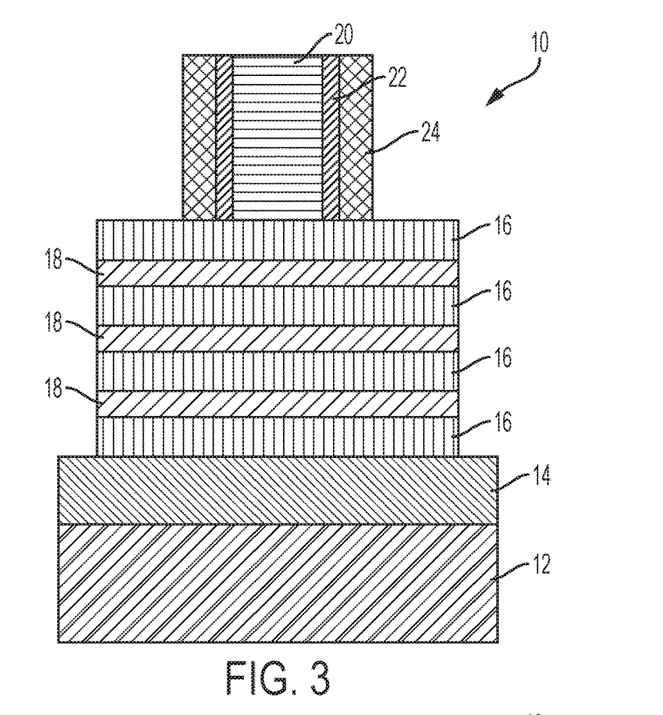
FIG. 3 depicts a perspective view of the semiconductor structure after a fabrication operation according to one or more embodiments of the present invention.

FIG. 3 depicts a cross-sectional view of the semiconductor structure 10 of FIG. 2 after deposition and patterning of a bilayer spacer on sidewalls of the dummy gate 20. The bilayer includes a silicon borocarbonitride (SiBCN) layer 22 directly on the sidewalls and a silicon oxycarbide (SiCO) layer 24 on the SiBCN layer 22. The SiBCN layer 22 has a dielectric constant ranging from 5.0 to 5.5. The SiCO layer 24 has a dielectric constant of about 4.5 and as will be discussed in greater detail below will function as a sacrificial layer. In one or more embodiments, the SIBCN layer 22 has a thickness of about 2 nanometers (nm) to about 6 nm. In one or more embodiments, the SiCO layer 22 has a thickness of about 4 nanometers (nm) to about 12 nm. The SiBCN 22 has a thickness less than the SiCO layer 24. In one or more embodiments, the thickness of the SiBCN layer is at least one half that of the SiCO layer 24. In an exemplary embodiment, the thickness of the SiBCN layer is about 3 nm and the thickness of the SiCO layer 24 is about 8 nm. It should be apparent that the dummy gate 20 and bilayer spacer layers 22, 24 wrap around the nanosheet stacks. In one or more embodiments, other combinations of two different materials can also be used for layers 22, 24. For example, the layer 22 can be a first dielectric material such as silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN). The layer 24 can be a material different from the material of layer 22.

Figure 4:
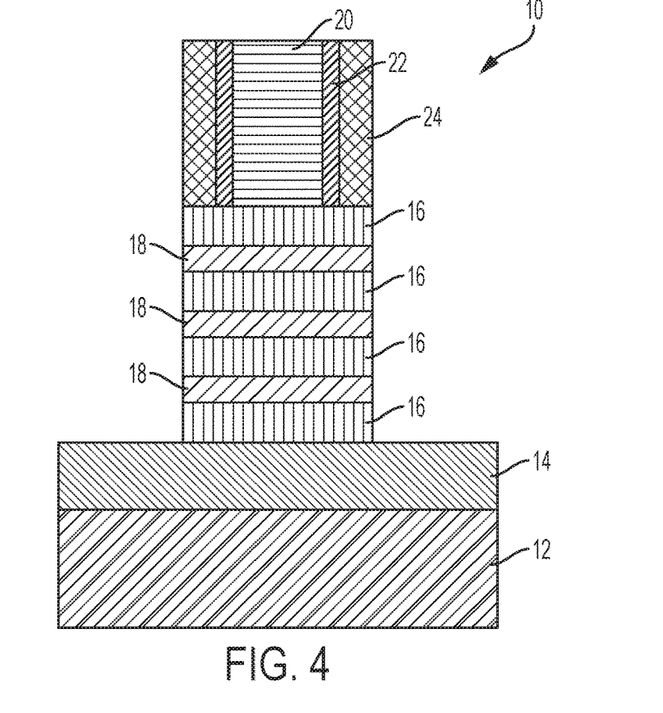
FIG. 4 depicts a cross-sectional view of the semiconductor structure after a fabrication operation according to one or more embodiments of the present invention.

FIG. 4 depicts a cross-sectional view of the semiconductor structure 10 of FIG. 3 after patterning the nanosheet stack to accommodate the S/D regions to be formed adjacent the nanosheet stack.

Figure 5:
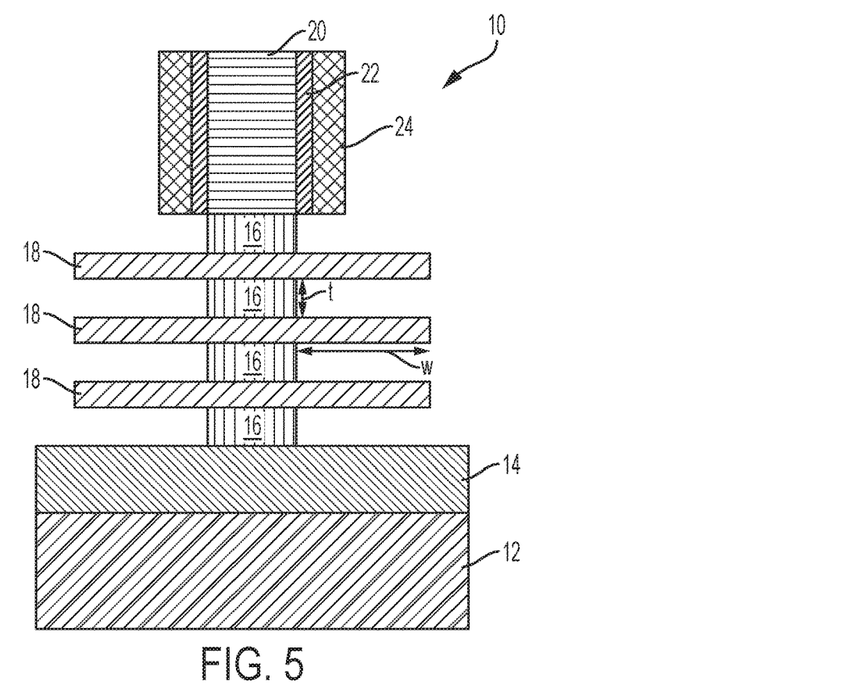
FIG. 5 depicts a cross-sectional view of the semiconductor structure after a fabrication operation according to one or more embodiments of the present invention.

FIG. 5 depicts a cross-sectional view of the semiconductor structure 10 of FIG. 4 after selective lateral etch of the SiGe layers 16. By way of example, the lateral etch process can utilize a mix of ammonia ($NH_4OH$) and hydrogen peroxide ($H_2O_2$) aqueous solution at an elevated temperature to provide selective etching of SiGe relative to Si. Alternatively, the lateral etch can utilize gas phase hydrogen chloride (HCl). The presence of the sacrificial layer 24 such as SiCO increases the lateral etch amount (W) to ensure that W is greater than the gap (t) between the nanosheets.

Figure 6:
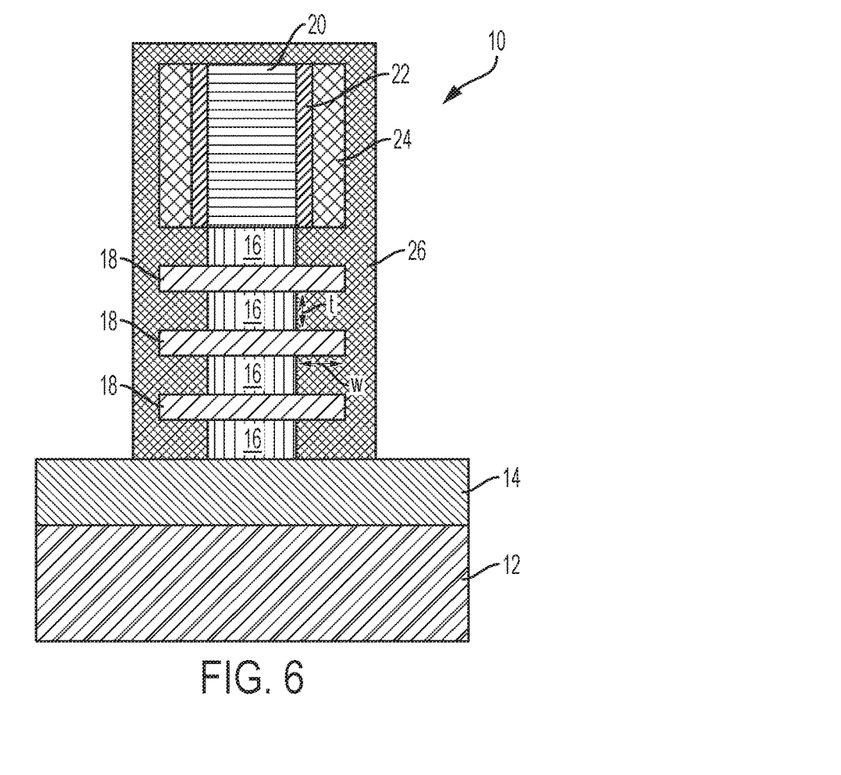
FIG. 6 depicts a cross-sectional view of the semiconductor structure after a fabrication operation according to one or more embodiments of the present invention.

FIG. 6 depicts a cross-sectional view of the semiconductor structure 10 of FIG. 5 subsequent to conformal deposition of a dielectric layer 26 at a thickness effective to provide pinch-off in the gaps between the Si layers 18. By way of example, if (t) is equal to 10 nm, a conformal deposition of 6 nm of the dielectric layer will pinch off the gap. Suitable dielectric materials include, without limitation, dielectric oxides (e.g., silicon oxide, hafnium oxide, or aluminum oxide), dielectric nitrides (e.g., silicon nitride), dielectric oxynitrides, or any combination thereof. Other suitable dielectric materials such as silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN). The spacer material is deposited by a deposition process, for example, chemical vapor deposition (CVD) or atomic layer deposition (ALD), molecular layer deposition (MLD), or the like.

Figure 7:
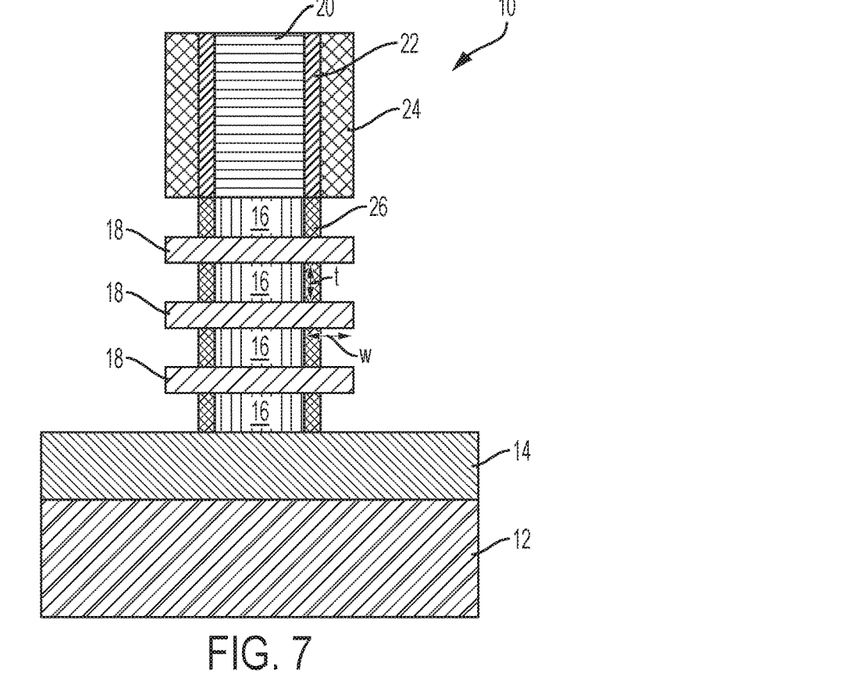
FIG. 7 depicts a cross-sectional view of the semiconductor structure after a fabrication operation according to one or more embodiments of the present invention.

FIG. 7 depicts a cross-sectional view of the semiconductor structure 10 of FIG. 6 subsequent to an etch back process with intentional over etch to expose a portion of the Si layers 18, i.e., the end portions of the Si layers 18. It should be noted that a large over etch can only be done when W>t. Otherwise, there is a potential for losing all of the inner spacer 26 with a large over etch. The dielectric layer 26 is different from the layer 24 so that in the next process step (etching back step), the dielectric layer 26 can be etched back selective to the layer 24.

Figure 8:
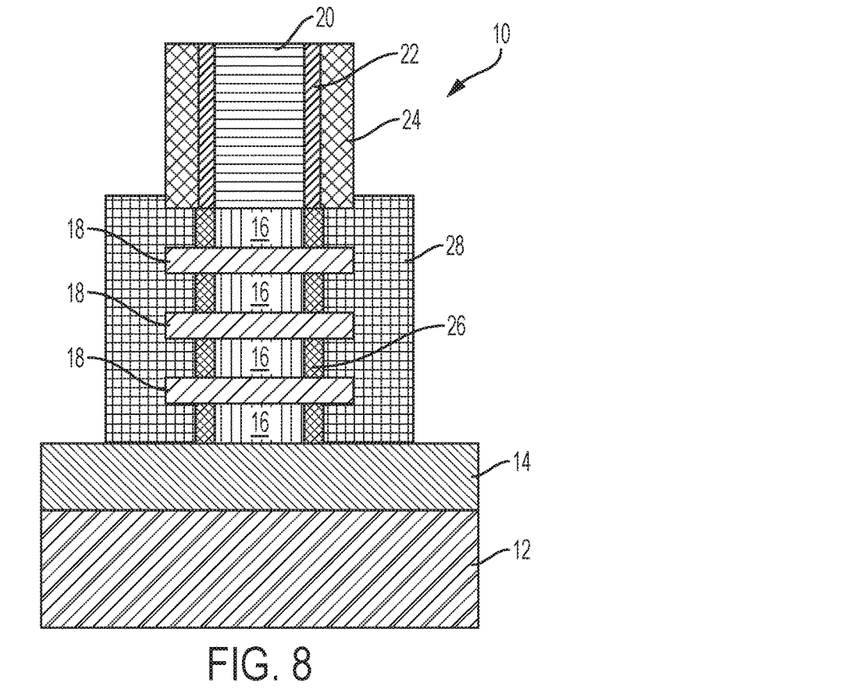
FIG. 8 depicts a cross-sectional view of the semiconductor structure after a fabrication operation according to one or more embodiments of the present invention.

FIG. 8 depicts a cross-sectional view of the semiconductor structure 10 of FIG. 7 subsequent to epitaxial growth of the S/D regions from the exposed portions of the Si layer 18. The exposed portions of the Si layer and exposed horizontal surfaces increase the area of the seed layer to help provide and control the epitaxial growth. Increasing the seed layer area improves epitaxy quality. Additionally, the narrow inner spacer allows the in situ doped S/D epitaxy to be closer to the Si layer (channel) so as to improve junction sharpness.

Figure 9:
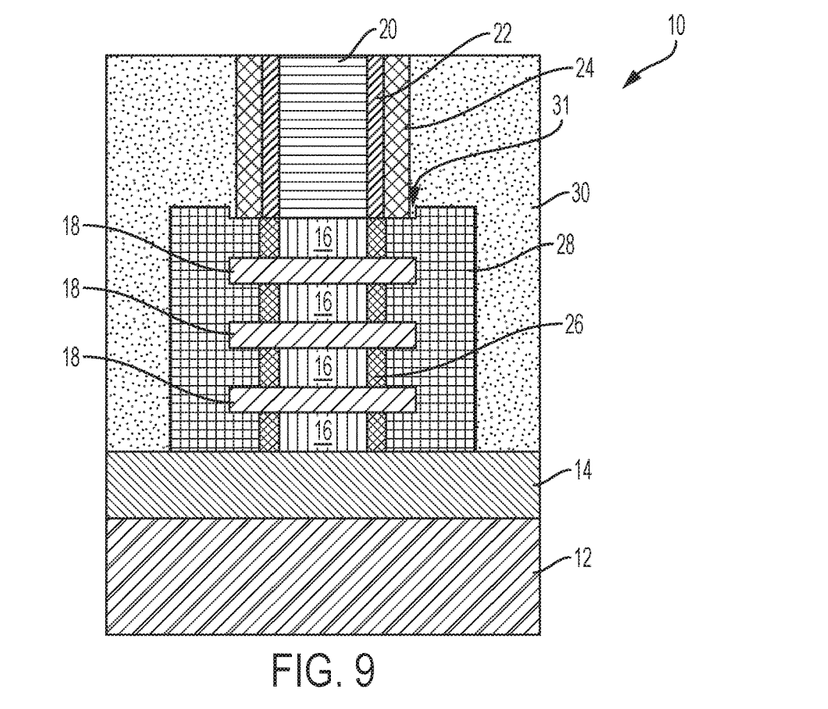
FIG. 9 depicts a cross-sectional view of the semiconductor structure after a fabrication operation according to one or more embodiments of the present invention.

FIG. 9 depicts a cross-sectional view of the semiconductor structure 10 of FIG. 8 subsequent to lateral trimming of the sacrificial SiCO layer 24, if needed, followed by deposition of an interlevel dielectric (ILD) 30 followed by planarization to the dummy gate 20 such as by, for example, chemical mechanical planarization (CMP). Lateral trimming of the sacrificial SiCO layer 24 can provide a recess 31 so as to expose an inner sidewall of the source or drain region 28 that is subsequently filled with the ILD. As such, the end portions of the Si layers 18 extend beyond the inner SiBCN inner spacer layer 22 and the sacrificial SiCO layer 24.

The ILD may include any materials known in the art, such as, for example, porous silicates, carbon doped oxides, silicon dioxides, silicon nitrides, silicon oxynitrides, or other dielectric materials. The ILD may be formed using any method known in the art, such as, for example, chemical vapor deposition, plasma enhanced chemical vapor deposition, spin-on coating, flowable oxide deposition, atomic layer deposition, or physical vapor deposition. In some embodiments, the ILD film can be densified by thermal anneal, plasma treatment, and/or ultraviolet (UV) treatment.

Figure 10:
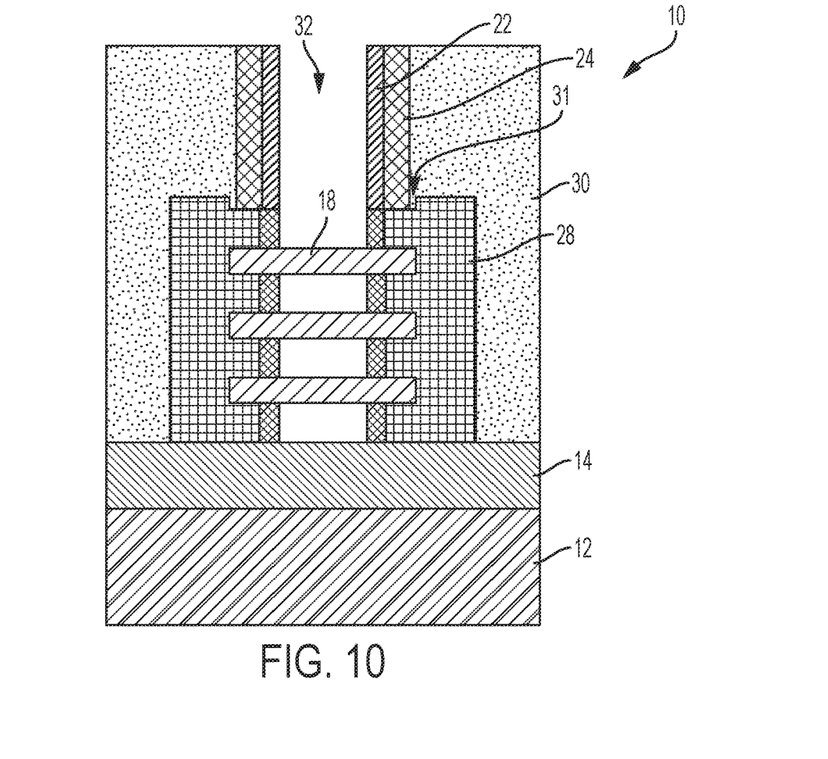
FIG. 10 depicts a cross-sectional view of the semiconductor structure after a fabrication operation according to one or more embodiments of the present invention.

FIG. 10 depicts a cross-sectional view of the semiconductor structure 10 of FIG. 9 subsequent to selective removal of the dummy gate and selective removal the SiGe between the Si layers 18 to form a recess 32 to the buried oxide layer 14.

Figure 11:
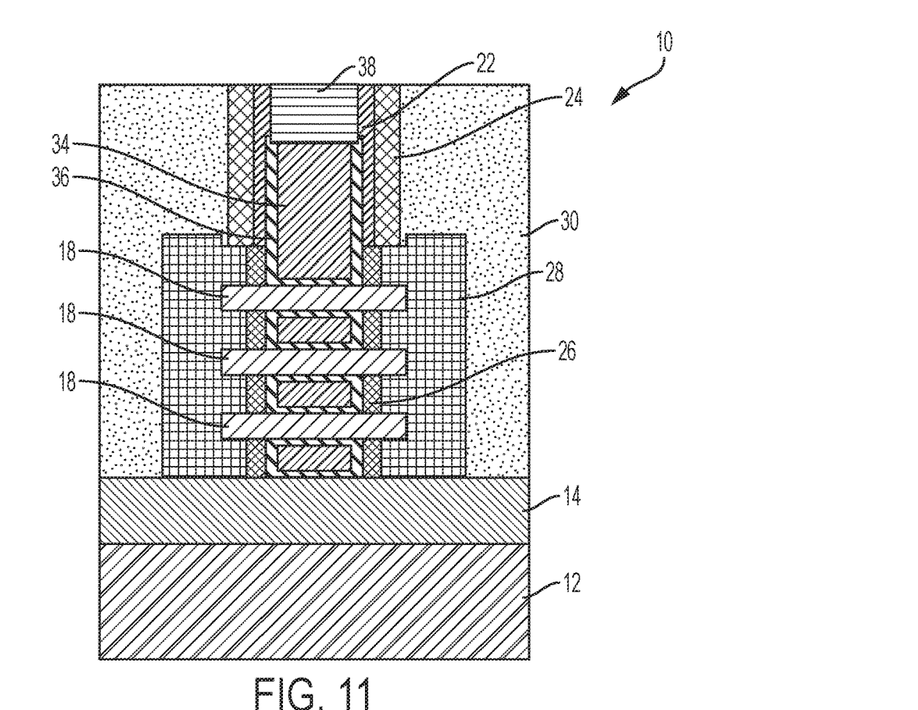
FIG. 11 depicts a cross-sectional view of the semiconductor structure after a fabrication operation according to one or more embodiments of the present invention.

FIG. 11 depicts a cross-sectional view of the semiconductor structure 10 of FIG. 10 subsequent to formation of a gate dielectric 34 and gate conductor 36 in the recess 32, which includes wrapping the gate dielectric and gate conductor around the Si layers 18 as shown. The gate dielectric 34 and gate conductor 36 is then recessed and a dielectric material is deposited into the recess to form the gate cap 38.

The gate dielectric can include any suitable dielectric material, including but not limited to silicon oxide, silicon nitride, silicon oxynitride, high-k (k stands for the relative dielectric constant) materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Gate conductor can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In some embodiments, a work function layer (not shown) is formed between the high-k dielectric and the gate material. The work function layer can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layer further modifies the work function of the gate material.

Figure 12:
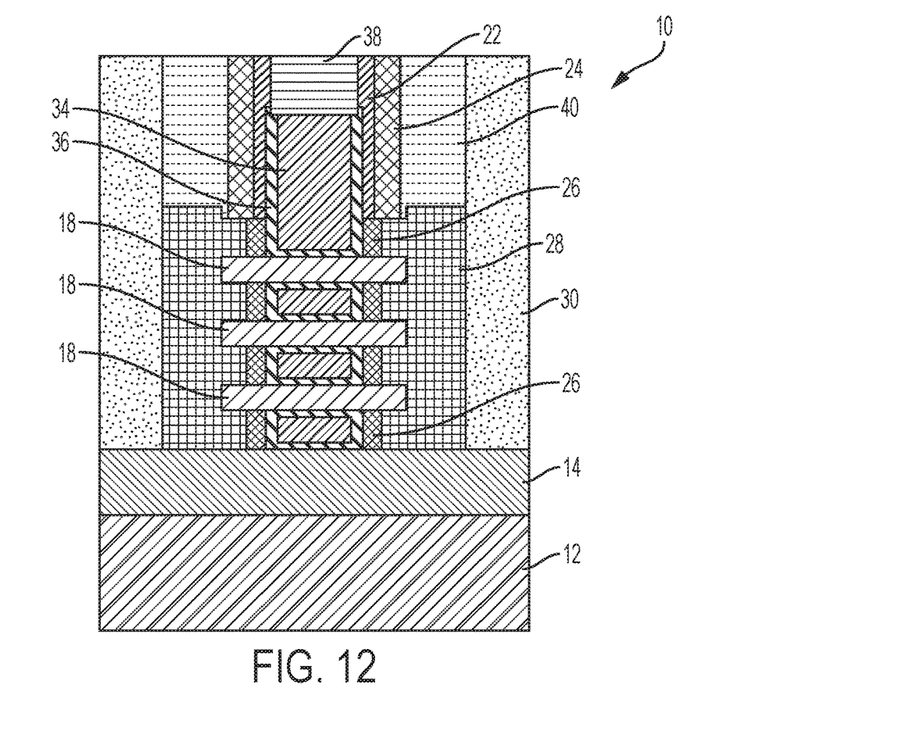
FIG. 12 depicts a cross-sectional view of the semiconductor structure after a fabrication operation according to one or more embodiments of the present invention.

FIG. 12 depicts a cross-sectional view of the semiconductor structure 10 of FIG. 11 subsequent to formation of the contacts 40 to the S/D regions 28. The trench openings for forming the contacts 40 are self-aligned to spacer layer 24 and filled with a metal conductor. The metal conductor filled contacts 40 also fill the recess 31 between the SiCO layer 24 and the inner sidewall of the S/D region 28. A directional etch process such as a reactive ion etch can be used to for the trench openings.

Figure 13:
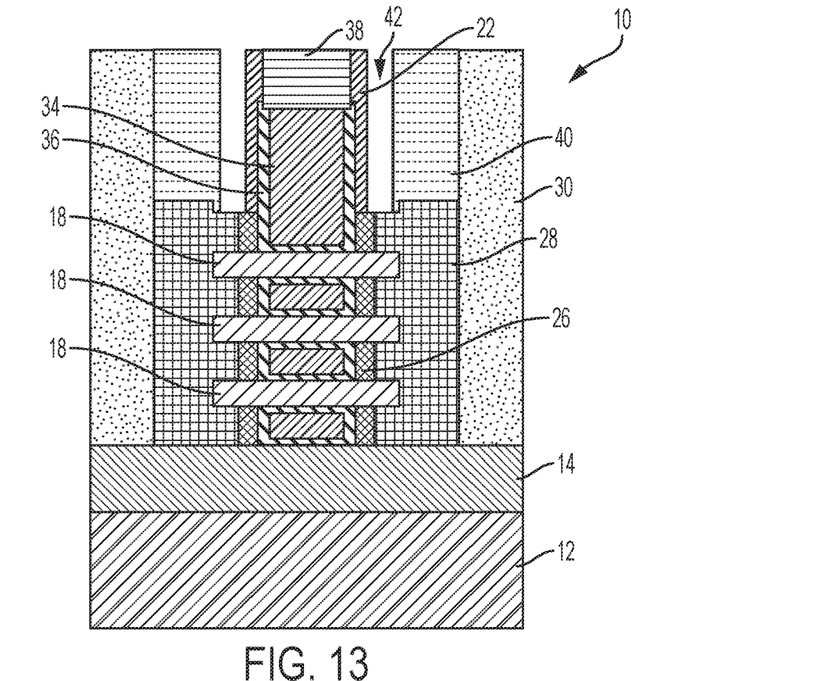
FIG. 13 depicts a cross-sectional view of a semiconductor structure after a fabrication operation according to one or more embodiments of the present invention.

FIG. 13 depicts a cross-sectional view of the semiconductor structure 10 of FIG. 12 subsequent to removal of the sacrificial SiCO spacer layer 24. The SiBCN spacer layer 22 protects the high-k dielectric/metal gate during removal of the sacrificial SiCO spacer layer 24. As shown, by removing the sacrificial layer 24, gaps 42 are formed between the gate structure 34, 36 and S/D contacts 40.

Figure 14:
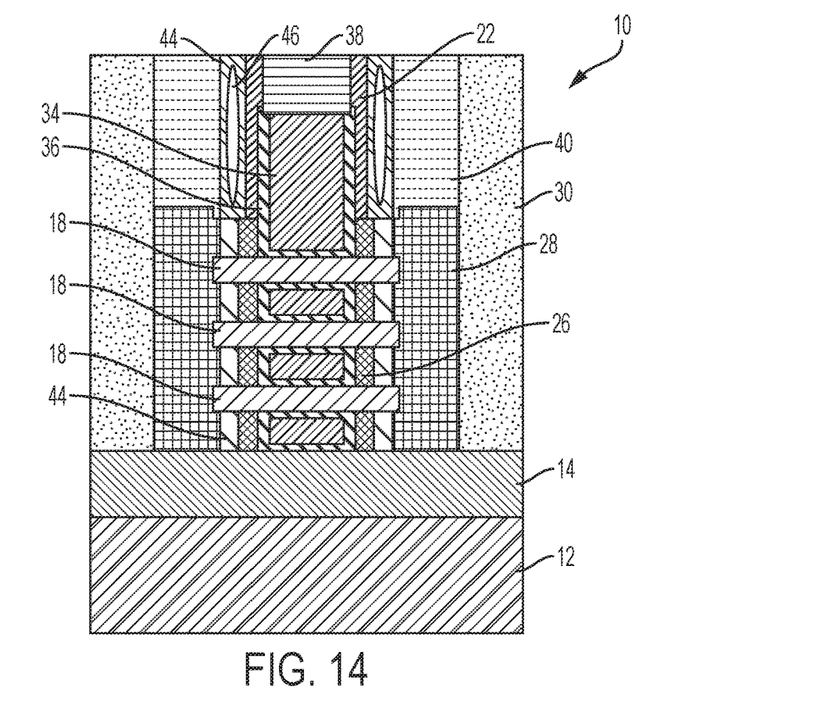
FIG. 14 depicts a cross-sectional view of the semiconductor structure after a fabrication operation according to one or more embodiments of the present invention.

FIG. 14 depicts a cross-sectional view of the semiconductor structure 10 of FIG. 13 subsequent to non-conformal deposition of a dielectric spacer 44 followed by a planarization process such as CMP. The non-conformal deposition of the dielectric spacer pinches off to form an airgap 46 within the dielectric spacer 44. The airgap 46 is vertically provided along the entire gate structure and nanosheets. The presence of the airgap spacer between the gate and the contact reduces the parasitic capacitance.

Advantageously, the sacrificial spacer layer 24 provides multiple functions. The sacrificial spacer layer 24 enables inner spacer lateral trimming to bring the in situ S/D epitaxy closer to the channel; enables extended Si nanosheet ends to increase the epitaxy seed layer and epitaxy quality; serves as a placeholder for the airgap spacer; among others. Consequently, increased junction sharpness and decreased parasitic capacitance are obtained since the use of the sacrificial spacer 24 decouples these parameters.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a nanosheet transistor with reduced parasitic capacitance and improved junction sharpness, the method comprising:
   depositing a bilayer comprising an inner spacer layer and a sacrificial layer on a dummy gate, wherein the dummy gate is formed on a nanosheet stack comprising Si layers and SiGe layers;
   laterally etching the SiGe layers relative to the Si layers such that W is greater than t, wherein W is a lateral etch width and t is a gap distance between Si layers;
   forming an inner spacer adjacent the SiGe layers having a width such that the Si layers have exposed end portions;
   epitaxially growing source/drain regions from the exposed end portions of the Si layers;
   depositing an interlevel dielectric layer;
   selectively removing the dummy gate and remaining portions of the SiGe layers and depositing a high-k dielectric-metal gate structure therein;
   forming contacts in the interlevel dielectric layer to the source/drain regions;
   selectively removing the sacrificial layer to form a gap between the inner spacer layers adjacent the high-k dielectric-metal gate structure and the contacts; and
   non-conformally depositing a dielectric into the gap to form an airgap spacer therein.

2. The method of claim 1, wherein the inner spacer of the bilayer comprises SiBCN and the sacrificial layer comprises SiCO.

3. The method of claim 1, wherein laterally etching the SiGe layers from the nanosheet stacks comprises exposing the SiGe layers to HCl vapor.

4. The method of claim 1, wherein forming the inner spacer adjacent the SiGe layers comprises conformally depositing a dielectric layer at a thickness effective to pinch off between the Si layers followed by etch back with an overetch to provide the exposed end portions of the Si layers.

5. The method of claim 4, wherein the dielectric layer comprises silicon nitride.

6. The method of claim 1 further comprising laterally trimming the sacrificial layer prior to depositing the interlevel dielectric layer to provide a recess between the inner spacer layer about the high-k dielectric-metal gate structure and an inner sidewall of the source/drain region.

7. The method of claim 6, wherein forming the contacts in the interlevel dielectric layer to the source/drain regions fills the recess.

8. The method of claim 6, wherein the SiGe has a germanium content from about 5 atomic percent to about 70 atomic percent.

9. A method for forming a nanosheet transistor with reduced parasitic capacitance and improved junction sharpness, the method comprising:
   depositing a dummy gate onto the nanosheet stack and sidewalls thereof, the nanosheet stack comprising epitaxially deposited silicon layers sandwiched between SiGe layers;
   depositing a bilayer spacer onto sidewalls of the dummy gate comprising a SiBCN layer in direct contact with the sidewalls and a SiCO sacrificial layer on the SiBCN layer;
   recessing the nanosheet stack to form openings for source or drain regions, wherein the openings are self-aligned to the SiCO sacrificial layer;
   laterally etching the SiGe layers to create a gap between Si layers, wherein W>t, wherein W is a lateral etch width of the SiGe removed and t is a vertical distance between Si layers;
   conformally depositing a first dielectric layer in an amount effective to fill the gap between the Si layers;
   etching back the first dielectric layer to form an inner spacer layer of the first dielectric on sidewalls of the SiGe layers and expose end portions of the Si layers;
   epitaxially growing the source/drain regions from the exposed end portions of the Si layers to the substrate;
   removing the dummy gate and the SiGe layer between the Si layers to form openings therein;
   forming a high-k dielectric-metal gate structure in the openings;
   recessing a top portion of the high-k dielectric-metal gate structure and depositing a dielectric gate cap therein;
   forming contacts to the source or drain regions;
   selectively removing the SiCO sacrificial spacer layer to form a gap between the high-k dielectric-metal gate structure and the contacts; and
   non-conformally depositing a second dielectric in the gap for form an airgap spacer.

10. The method of claim 9 further comprising planarizing the structure to the gate cap.

11. The method of claim 9, wherein the dielectric layer comprises silicon nitride.

12. The method of claim 9, wherein the substrate includes a buried oxide layer.

13. The method of claim 9, wherein selectively removing the SiGe layers from the nanosheet stacks comprises exposing the SiGe layers to HCl vapor.

14. The method of claim 9 further comprising laterally trimming the SiCO sacrificial layer subsequent to epitaxially growing the source/drain regions to form a recess between the inner SiBCN spacer and an inner sidewall of the source/drain regions.

15. The method of claim 14, wherein forming contacts to the source or drain regions fills the recess.

* * * * *